United States Patent
Lung et al.

(10) Patent No.: US 12,477,775 B2
(45) Date of Patent: Nov. 18, 2025

(54) NANOSTRUCTURE FIELD-EFFECT TRANSISTOR DEVICE AND METHOD OF FORMING

(71) Applicant: Taiwan Semiconductor Manufacturing Co., Ltd., Hsinchu (TW)

(72) Inventors: Chun-Ming Lung, Hsinchu (TW); Che-Hao Chang, Hsinchu (TW); Zhen-Cheng Wu, Hsinchu (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 650 days.

(21) Appl. No.: 17/716,514

(22) Filed: Apr. 8, 2022

(65) Prior Publication Data

US 2023/0040843 A1    Feb. 9, 2023

Related U.S. Application Data

(60) Provisional application No. 63/229,670, filed on Aug. 5, 2021.

(51) Int. Cl.
*H10D 30/67* (2025.01)
*H01L 21/02* (2006.01)
(Continued)

(52) U.S. Cl.
CPC ..... *H10D 30/6713* (2025.01); *H01L 21/0259* (2013.01); *H01L 21/02603* (2013.01);
(Continued)

(58) Field of Classification Search
CPC ........... H01L 21/0259; H01L 21/02603; H01L 21/26533; H01L 21/764; H10D 30/014;
(Continued)

(56) References Cited

U.S. PATENT DOCUMENTS 8,487,378 B2    7/2013    Goto et al.
8,729,634 B2    5/2014    Shen et al.
(Continued)

FOREIGN PATENT DOCUMENTS

KR    20180115392 A    10/2018
TW    202129723 A    8/2021

*Primary Examiner* — Brook Kebede
(74) *Attorney, Agent, or Firm* — Slater Matsil, LLP

(57) ABSTRACT

A method of forming a semiconductor device includes: forming a fin structure protruding above a substrate, where the fin structure includes a fin and a layer stack over the fin, the layer stack comprising alternating layers of a first semiconductor material and a second semiconductor material; forming a first dummy gate structure and a second dummy gate structure over the fin structure; forming an opening in the fin structure between the first dummy gate structure and the second dummy gate structure; converting an upper layer of the fin exposed at a bottom of the opening into a seed layer by performing an implantation process; selectively depositing a dielectric layer over the seed layer at the bottom of the opening; and selectively growing a source/drain material on opposing sidewalls of the second semiconductor material exposed by the opening.

20 Claims, 15 Drawing Sheets

(51) Int. Cl.
*H01L 21/265* (2006.01)
*H01L 21/764* (2006.01)
*H10D 30/01* (2025.01)
*H10D 30/43* (2025.01)
*H10D 62/10* (2025.01)
*H10D 64/01* (2025.01)
*H10D 84/01* (2025.01)
*H10D 84/03* (2025.01)
*H10D 84/85* (2025.01)

(52) U.S. Cl.
CPC ...... *H01L 21/26533* (2013.01); *H01L 21/764* (2013.01); *H10D 30/014* (2025.01); *H10D 30/031* (2025.01); *H10D 30/43* (2025.01); *H10D 30/6735* (2025.01); *H10D 30/6757* (2025.01); *H10D 62/116* (2025.01); *H10D 62/118* (2025.01); *H10D 62/121* (2025.01); *H10D 64/017* (2025.01); *H10D 64/018* (2025.01); *H10D 84/0167* (2025.01); *H10D 84/017* (2025.01); *H10D 84/0188* (2025.01); *H10D 84/038* (2025.01); *H10D 84/85* (2025.01)

(58) Field of Classification Search
CPC .. H10D 30/031; H10D 30/43; H10D 30/6713; H10D 30/6735; H10D 30/6757; H10D 62/116; H10D 62/118; H10D 62/121; H10D 64/017; H10D 64/018; H10D 84/017; H10D 84/0188; H10D 84/038; H10D 84/85

See application file for complete search history.

(56) References Cited

U.S. PATENT DOCUMENTS

| | | |
|---|---|---|
| 8,826,213 B1 | 9/2014 | Ho et al. |
| 8,887,106 B2 | 11/2014 | Ho et al. |
| 10,461,195 B2 | 10/2019 | Kwon et al. |
| 11,532,509 B2 | 12/2022 | Wu et al. |
| 2014/0282326 A1 | 9/2014 | Chen et al. |
| 2018/0301564 A1 | 10/2018 | Kwon et al. |
| 2019/0035888 A1* | 1/2019 | Wu ............... H10D 30/6757 |
| 2019/0341316 A1 | 11/2019 | Reznicek |
| 2020/0294865 A1* | 9/2020 | Cheng ............ H01L 21/02532 |
| 2020/0381426 A1* | 12/2020 | Xu ................. H01L 29/78696 |
| 2021/0134721 A1* | 5/2021 | Chiang ............ H10D 30/6713 |
| 2021/0202758 A1* | 7/2021 | Yeong ............. H10D 84/201 |

* cited by examiner

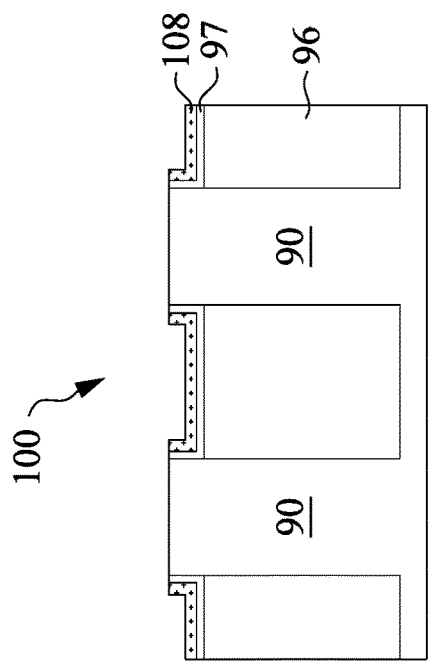
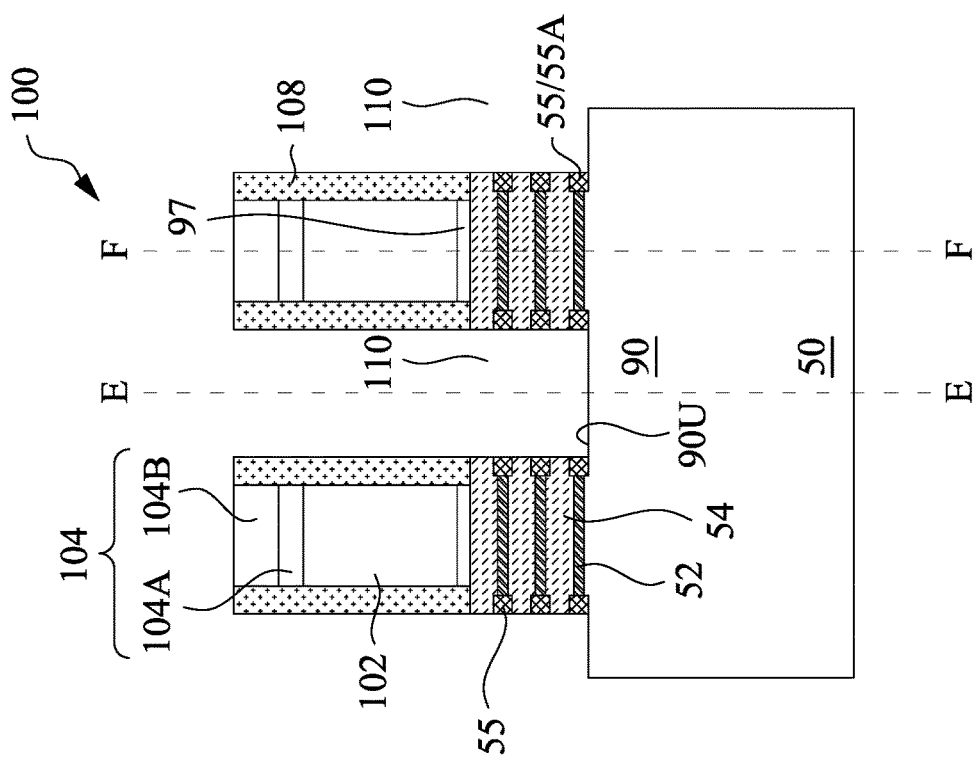
Figure 6A
Figure 6B

NANOSTRUCTURE FIELD-EFFECT TRANSISTOR DEVICE AND METHOD OF FORMING

PRIORITY CLAIM AND CROSS-REFERENCE

This application claims the benefit of U.S. Provisional Application No. 63/229,670, filed on Aug. 5, 2021 and entitled "Selectively Formed Air-Gap in Patterned Structure of Interest," which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3A, 3B, 4A, 4B, 5A-5C, 6A-6C, 7-10, 11A-11C, 12A, 12B, 13A, 13B, 14A, and 14B are cross-sectional views of a nanostructure field-effect transistor device at various stages of manufacturing, in accordance with an embodiment.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, air gaps are formed under source/drain regions of a nanostructure device, e.g., between the source/drain regions and the underlying fin. The air gaps advantageously reduce fringing capacitance and leakage current of the device formed. To form the air gaps, source/drain openings are formed in the fin structure between adjacent dummy gate structures. Next, an ion implantation process is performed to convert an upper layer of the fin exposed by the source/drain openings into a seed layer. Next, a dielectric layer is selectively formed on the seed layer. Next, an epitaxial source/drain material is selectively grown on a semiconductor material exposed at the sidewalls of the source/drain openings. The dielectric layer at the bottom of the source/drain openings prohibits the growth of the epitaxial source/drain material from the bottom of the source/drain openings. As a result, the source/drain material grows laterally from the sidewalls of the semiconductor material exposed by the source/drain openings and merges to form the source/drain regions, air gaps are formed between the source/drain regions and the underlying dielectric layer disposed on the fins.

Figure 1:
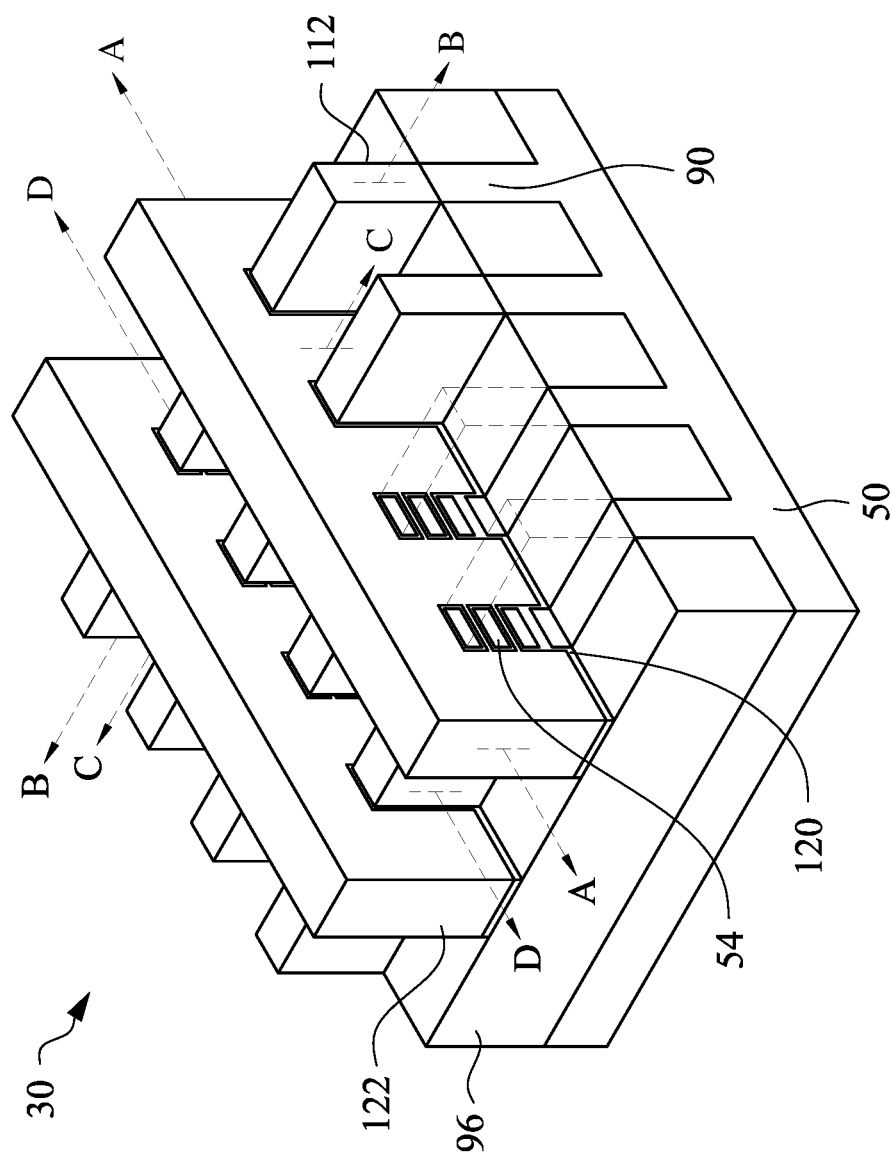
FIG. 1 illustrates an example of a nanostructure field-effect transistor (NSFET) device in a three-dimensional view, in accordance with some embodiments.

FIG. 1 illustrates an example of a nanostructure field-effect transistor (NSFET) device 30 in a three-dimensional view, in accordance with some embodiments. The NSFET device 30 comprises semiconductor fins 90 (also referred to as fins) protruding above a substrate 50. A gate electrode 122 (e.g., a metal gate) is disposed over the fins, and source/drain regions 112 are formed on opposing sides of the gate electrode 122. A plurality of nanostructures 54 (e.g., nanowires, or nanosheets) are formed over the fins 90 and between source/drain regions 112. Isolation regions 96 are formed on opposing sides of the fins 90. A gate dielectric layer 120 is formed around the nanostructures 54. Gate electrodes 122 are over and around the gate dielectric layer 120.

FIG. 1 further illustrates reference cross-sections that are used in later figures. Cross-section A-A is along a longitudinal axis of the gate electrode 122 and in a direction, for example, perpendicular to the direction of current flow between the source/drain regions 112 of the NSFET device 30. Cross-section B-B is perpendicular to cross-section A-A and is along a longitudinal axis of the fin 90 and in a direction of, for example, a current flow between the source/drain regions 112 of the NSFET device. Cross-section C-C is parallel to cross-section B-B and between two neighboring fins 90. Cross-section D-D is parallel to cross-section A-A and extends through source/drain regions 112 of the NSFET device. Subsequent figures refer to these reference cross-sections for clarity.

FIGS. 2, 3A, 3B, 4A, 4B, 5A-5C, 6A-6C, 7-10, 11A-11C, 12A, 12B, 13A, 13B, 14A, and 14B are cross-sectional views of a nanostructure field-effect transistor (NSFET) device 100 at various stages of manufacturing, in accordance with an embodiment.

Figure 2:
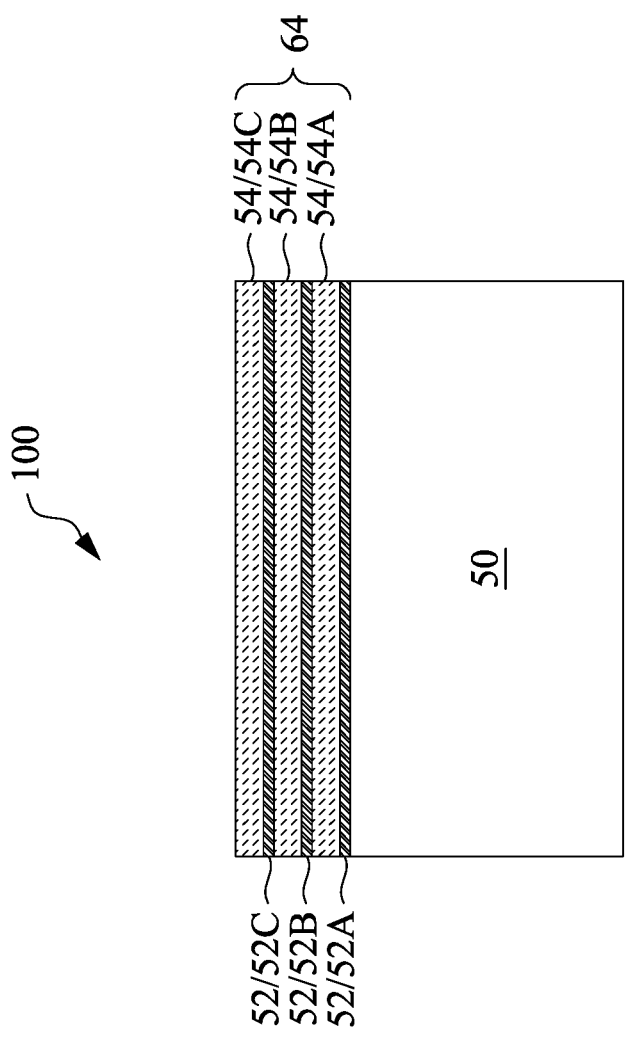

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

A multi-layer stack 64 is formed on the substrate 50. The multi-layer stack 64 includes alternating layers of a first semiconductor material 52 and a second semiconductor material 54. In FIG. 2, layers formed by the first semiconductor material 52 are labeled as 52A, 52B, and 52C, and layers formed by the second semiconductor material 54 are labeled as 54A, 54B, and 54C. The number of layers formed by the first and the second semiconductor materials illustrated in FIG. 2 are merely non-limiting examples. Other numbers of layers are also possible and are fully intended to be included within the scope of the present disclosure.

In some embodiments, the first semiconductor material 52 is an epitaxial material appropriate for forming channel regions of p-type FETs, such as silicon germanium ($Si_xGe_{1-x}$, where x can be in the range of 0 to 1), and the second semiconductor material 54 is an epitaxial material appropriate for forming channel regions of n-type FETs, such as silicon. The multi-layer stacks 64 (which may also be referred to as an epitaxial material stack) will be patterned to form channel regions of an NSFET in subsequent processing. In particular, the multi-layer stacks 64 will be patterned and etched to form horizontal nanostructures (e.g., nanosheets or nanowires), with the channel regions of the resulting NSFET including multiple horizontal nanostructures.

The multi-layer stacks 64 may be formed by an epitaxial growth process, which may be performed in a growth chamber. During the epitaxial growth process, the growth chamber is cyclically exposed to a first set of precursors for selectively growing the first semiconductor material 52, and then exposed to a second set of precursors for selectively growing the second semiconductor material 54, in some embodiments. The first set of precursors includes precursors for the first semiconductor material (e.g., silicon germanium), and the second set of precursors includes precursors for the second semiconductor material (e.g., silicon). In some embodiments, the first set of precursors includes a silicon precursor (e.g., silane) and a germanium precursor (e.g., a germane), and the second set of precursors includes the silicon precursor but omits the germanium precursor. The epitaxial growth process may thus include continuously enabling a flow of the silicon precursor to the growth chamber, and then cyclically: (1) enabling a flow of the germanium precursor to the growth chamber when growing the first semiconductor material 52; and (2) disabling the flow of the germanium precursor to the growth chamber when growing the second semiconductor material 54. The cyclical exposure may be repeated until a target number of layers is formed.

FIGS. 3A, 3B, 4A, 4B, 5A-5C, 6A-6C, 7-10, 11A-11C, 12A, 12B, 13A, 13B, 14A, and 14B are cross-sectional views of the NSFET device 100 at subsequent stages of manufacturing, in accordance with an embodiment. FIGS. 3A, 4A, 5A, 6A, 7-10, 11A, 12A, 13A, and 14A are cross-sectional views along cross-section B-B in FIG. 1. FIGS. 3B, 4B, 5C, 6C, 11C, 12B, 13B, and 14B are cross-sectional views along cross-section A-A in FIG. 1. FIGS. 5B, 6B, and 11B are cross-sectional views along cross-section D-D in FIG. 1. Although two fins and two gate structures are illustrated in the figures as a non-limiting example, it should be appreciated that other numbers of fins and other numbers of gate structures may also be formed.

Figure 3B:
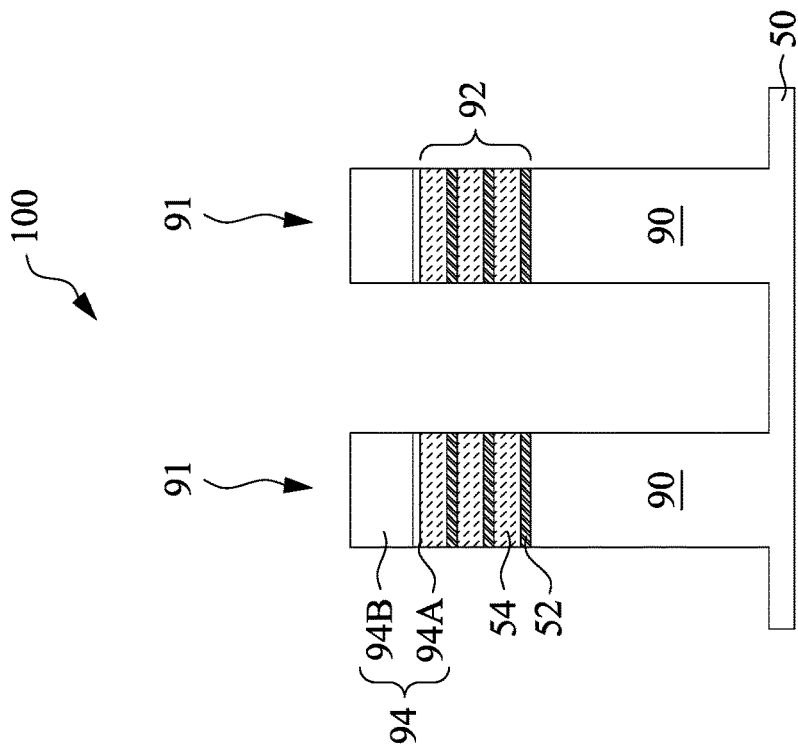
Figure 3A:
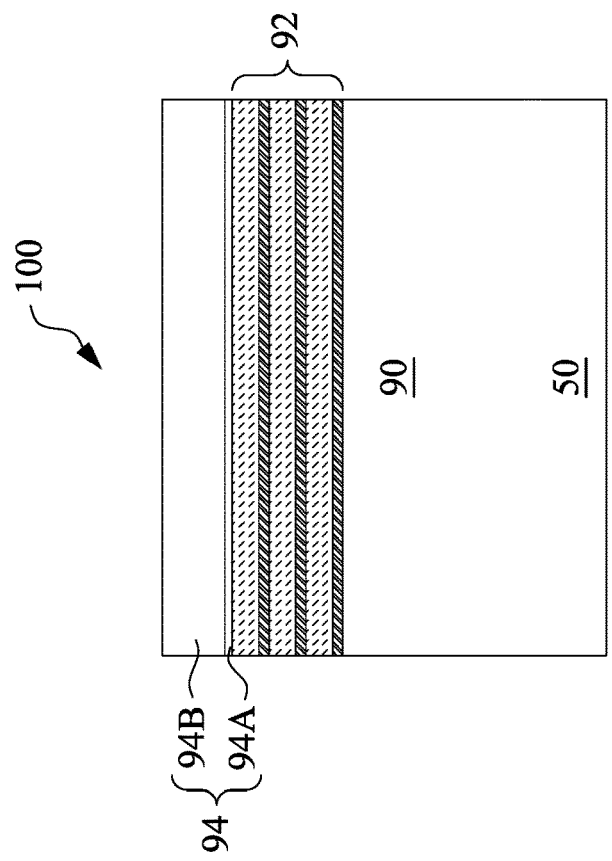

In FIGS. 3A and 3B, fin structures 91 are formed protruding above the substrate 50. Each of the fin structures 91 includes a semiconductor fin 90 (also referred to as a fin) and a layer stack 92 overlying the semiconductor fin 90. The layer stack 92 and the semiconductor fin 90 may be formed by etching trenches in the multi-layer stack 64 and the substrate 50, respectively. The layer stack 92 and the semiconductor fin 90 may be formed by a same etching process.

The fin structures 91 may be patterned by any suitable method. For example, the fin structures 91 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern, e.g., the fin structures 91.

In some embodiments, the remaining spacers are used to pattern a mask 94, which is then used to pattern the fin structures 91. The mask 94 may be a single layer mask, or may be a multilayer mask such as a multilayer mask that includes a first mask layer 94A and a second mask layer 94B. The first mask layer 94A and second mask layer 94B may each be formed from a dielectric material such as silicon oxide, silicon nitride, a combination thereof, or the like, and may be deposited or thermally grown according to suitable techniques. The first mask layer 94A and second mask layer 94B are different materials having a high etching selectivity. For example, the first mask layer 94A may be silicon oxide, and the second mask layer 94B may be silicon nitride. The mask 94 may be formed by patterning the first mask layer 94A and the second mask layer 94B using any acceptable etching process. The mask 94 may then be used as an etching mask to etch the substrate 50 and the multi-layer stack 64. The etching may be any acceptable etch process, such as a reactive ion etch (RIE), neutral beam etch (NBE), the like, or a combination thereof. The etching is an anisotropic etching process, in some embodiments. After the etching process, the patterned multi-layer stack 64 forms the layer stack 92, and the patterned substrate 50 forms the fin 90, as illustrated in FIGS. 3A and 3B. Therefore, in the illustrated embodiment, the layer stack 92 also includes alternating layers of the first semiconductor material 52 and the second semiconductor material 54, and the fin 90 is formed of a same material (e.g., silicon) as the substrate 50.

Figure 4B:
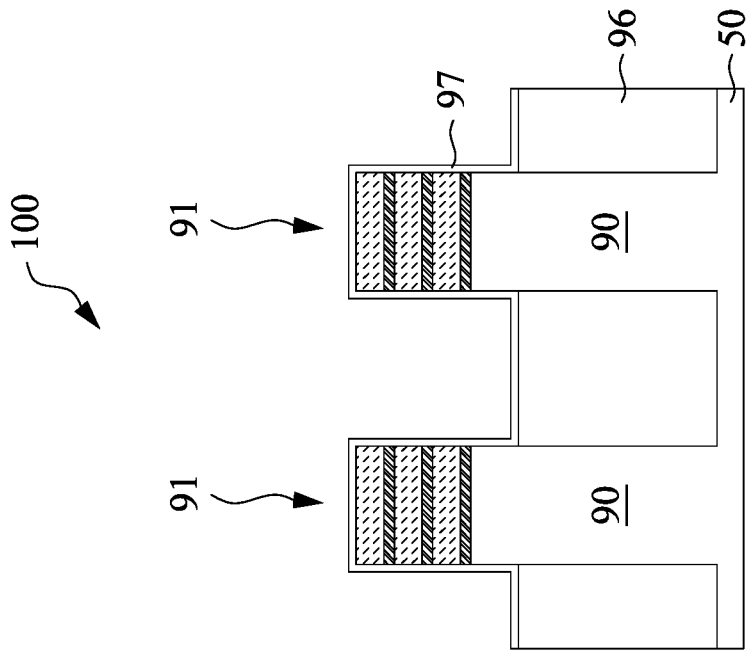
Figure 4A:
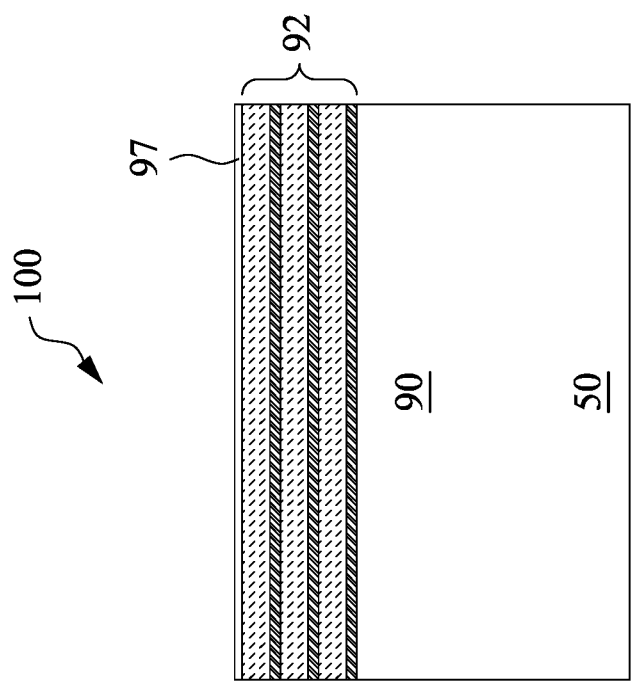
Figure 5B:
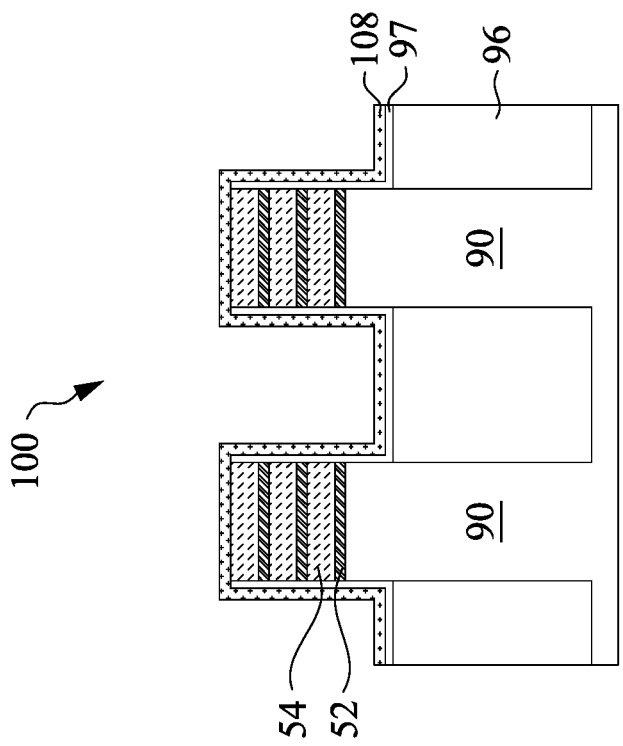

Next, in FIGS. 4A and 4B, Shallow Trench Isolation (STI) regions 96 are formed over the substrate 50 and on opposing sides of the fin structures 91. As an example to form the STI regions 96, an insulation material may be formed over the substrate 50. The insulation material may be an oxide such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by an FCVD process. An anneal process may be performed after the insulation material is formed.

In some embodiments, the insulation material is formed such that excess insulation material covers the fin structures 91. In some embodiments, a liner is first formed along surfaces of the substrate 50 and fin structures 91, and a fill material, such as those discussed above is formed over the liner. In some embodiments, the liner is omitted.

Next, a removal process is applied to the insulation material to remove excess insulation material over the fin structures 91. In some embodiments, a planarization process such as a chemical mechanical polish (CMP), an etch back process, combinations thereof, or the like, may be utilized. The planarization process exposes the layer stacks 92 such that top surfaces of the layer stacks 92 and the insulation material are level after the planarization process is complete. Next, the insulation material is recessed to form the STI regions 96. The insulation material is recessed such that the layer stacks 92 protrude from between neighboring STI regions 96. Top portions of the semiconductor fins 90 may also protrude from between neighboring STI regions 96. Further, the top surfaces of the STI regions 96 may have a flat surface as illustrated, a convex surface, a concave surface (such as dishing), or a combination thereof. The top surfaces of the STI regions 96 may be formed flat, convex, and/or concave by an appropriate etch. The STI regions 96 may be recessed using an acceptable etching process, such as one that is selective to the material of the insulation material (e.g., etches the material of the insulation material at a faster rate than the material of the fin 90 and the layer stack 92). For example, a chemical oxide removal with a suitable etchant such as dilute hydrofluoric (dHF) acid may be used.

Still referring to FIGS. 4A and 4B, a dummy dielectric layer 97 is formed over the layer stack 92 and over the STI regions 96. The dummy dielectric layer 97 may be, for example, silicon oxide, silicon nitride, a combination thereof, or the like, and may be deposited or thermally grown according to acceptable techniques. In an embodiment, a layer of silicon is conformally formed over the layer stack 92 and over the upper surface of the STI regions 96, and a thermal oxidization process is performed to convert the deposited silicon layer into an oxide layer as the dummy dielectric layer 97.

Figure 5A:
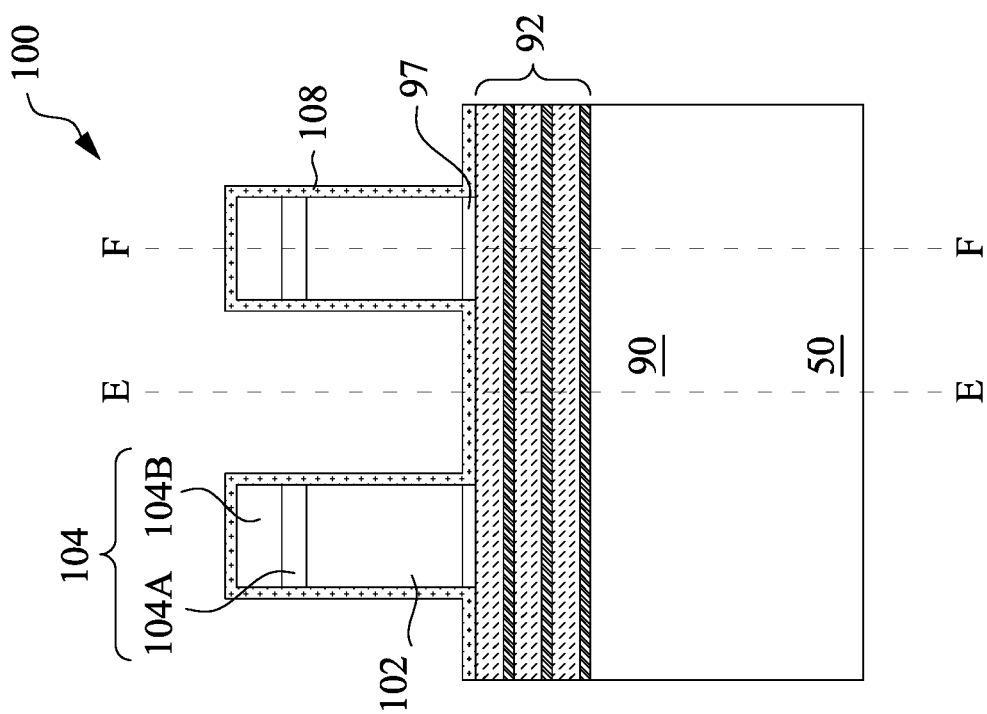
Figure 5C:
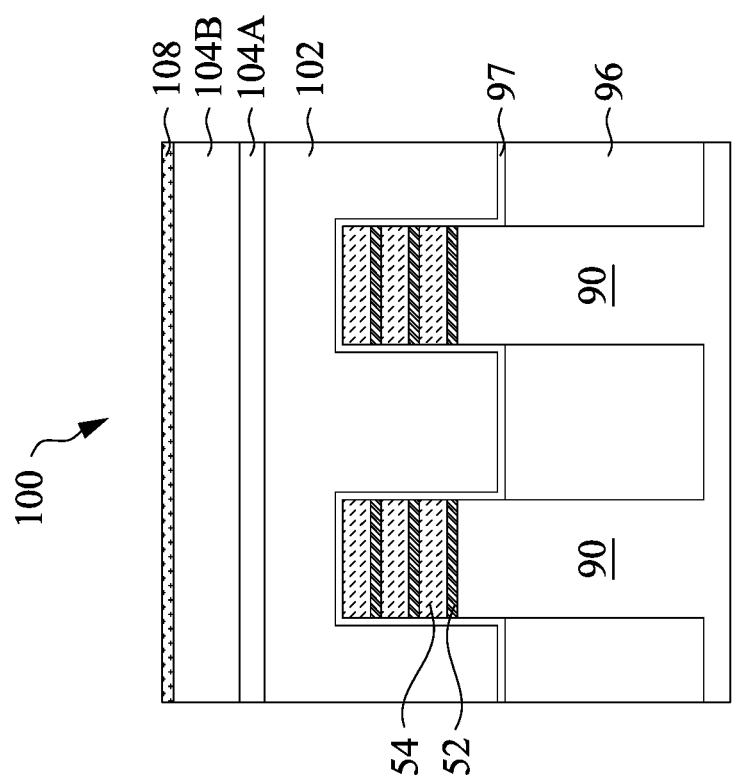
Figure 6C:
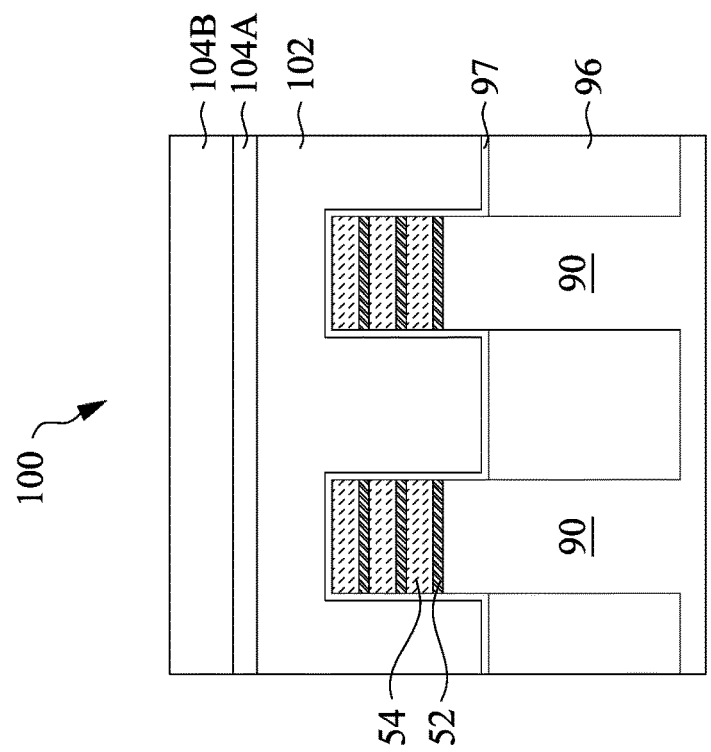

Next, in FIGS. 5A-5C, dummy gates 102 are formed over the fin structures 91. To form the dummy gates 102, a dummy gate layer may be formed over the dummy dielectric layer 97. The dummy gate layer may be deposited over the dummy dielectric layer 97 and then planarized, such as by a CMP. The dummy gate layer may be a conductive material and may be selected from a group including amorphous silicon, polycrystalline-silicon (polysilicon), poly-crystalline silicon-germanium (poly-SiGe), or the like. The dummy gate layer may be deposited by physical vapor deposition (PVD), CVD, sputter deposition, or other techniques known and used in the art. The dummy gate layer may be made of other materials that have a high etching selectivity from the STI regions 96.

Masks 104 are then formed over the dummy gate layer. The masks 104 may be formed from silicon nitride, silicon oxynitride, combinations thereof, or the like, and may be patterned using acceptable photolithography and etching techniques. In the illustrated embodiment, the mask 104 includes a first mask layer 104A (e.g., a silicon oxide layer) and a second mask layer 104B (e.g., a silicon nitride layer). The pattern of the masks 104 is then transferred to the dummy gate layer by an acceptable etching technique to form the dummy gates 102, and then transferred to the dummy dielectric layer by acceptable etching technique to form dummy gate dielectrics 97. The dummy gates 102 cover respective channel regions of the layer stacks 92. The pattern of the masks 104 may be used to physically separate each of the dummy gates 102 from adjacent dummy gates. The dummy gates 102 may also have a lengthwise direction substantially perpendicular to the lengthwise direction of the fin structures 91. The dummy gate 102 and the dummy gate dielectric 97 are collectively referred to as dummy gate structure, in some embodiments.

Next, a gate spacer layer 108 is formed by conformally depositing an insulating material over the layer stacks 92, STI regions 96, and dummy gates 102. The insulating material may be silicon nitride, silicon carbonitride, a combination thereof, or the like. In some embodiments, the gate spacer layer 108 includes multiple sublayers. For example, a first sublayer (sometimes referred to as a gate seal spacer layer) may be formed by thermal oxidation or a deposition, and a second sublayer (sometimes referred to as a main gate spacer layer) may be conformally deposited on the first sublayer.

FIGS. 5B and 5C illustrate cross-sectional views of the NSFET device 100 in FIG. 5A along cross-sections E-E and F-F in FIG. 5A, respectively. The cross-sections E-E and F-F correspond to cross-sections D-D and A-A in FIG. 1, respectively.

Next, in FIGS. 6A-6C, the gate spacer layers 108 are etched by an anisotropic etching process to form gate spacers 108. The anisotropic etching process may remove horizontal portions of the gate spacer layer 108 (e.g., portions over the STI regions 96 and the dummy gates 102), with remaining vertical portions of the gate spacer layer 108 (e.g., portions along sidewalls of the dummy gates 102 and the dummy gate dielectric 97) forming the gate spacers 108.

FIGS. 6B and 6C illustrate cross-sectional views of the NSFET device 100 in FIG. 6A along cross-sections E-E and F-F, respectively. In FIG. 6B, portions of the gate spacer layer 108 are illustrated between neighboring fins on the upper surface of the STI regions 96. Those portions of the gate spacer layer 108 may be left because the anisotropic etching process discussed above may not completely remove the gate spacer layer 108 disposed between neighboring fins, due to the small distance between the neighboring fins reducing efficiency of the anisotropic etching process. In other embodiments, the portions of the gate spacer layer 108 disposed on the upper surface of the STI regions 96 between neighboring fins are completely removed by the anisotropic etching process used for forming the gate spacers 108.

Next, openings 110 (which may also be referred to as recesses) are formed in the layer stacks 92. The openings 110 may extend through the layer stacks 92 and into the fins 90. The openings 110 may be formed by an anisotropic etching process using, e.g., the dummy gates 102 and the gate spacers 108 as an etching mask.

After the openings 110 are formed, a selective etching process is performed to recess end portions of the first semiconductor material 52 exposed by the openings 110 without substantially attacking the second semiconductor material 54. After the selective etching process, recesses (also referred to as sidewall recesses) are formed in the first semiconductor material 52 at locations where the removed end portions used to be.

Next, an inner spacer layer is formed (e.g., conformally) in the opening 110. The inner spacer layer also fills the sidewall recesses of the first semiconductor material 52 formed by the previous selective etching process. The inner spacer layer may be a suitable dielectric material, such as silicon carbonitride (SiCN), silicon oxycarbonitride (SiOCN), or the like, formed by a suitable deposition method such as PVD, CVD, atomic layer deposition (ALD), or the like. Next, an etching process, such as an anisotropic etching process, is performed to remove portions of the inner spacer layers disposed outside the sidewall recesses of the first semiconductor material 52. The remaining portions of the inner spacer layers (e.g., portions disposed inside the sidewall recesses of the first semiconductor material 52) form the inner spacers 55. As illustrated in FIG. 6A, the openings 110 expose sidewalls of the second semiconductor material 54 and expose an upper surface 90U of the fin 90. In the example of FIG. 6A, the upper surface 90U of the fin 90 is disposed vertically between an upper surface and a lower surface of a lowermost inner spacer 55A.

Figure 7:
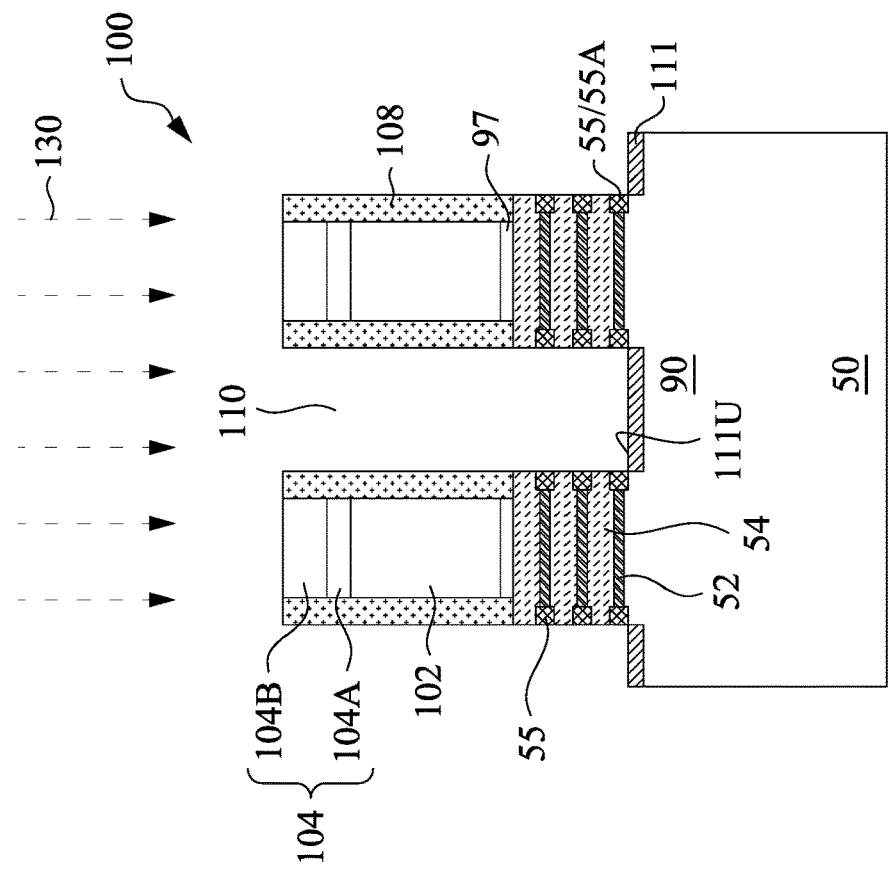

Next, in FIG. 7, an implantation process 130 is performed to convert an upper layer of the fin 90 exposed by the openings 110 into a seed layer 111. In some embodiments, the implantation process 130 is performed using a gas source comprising carbon, nitrogen, oxygen, or combination thereof. An example of the gas source may be, e.g., $O_2$, $N_2$, or $CO_2$. The gas source is ignited into a plasma comprising ions of carbon, nitrogen, and/or oxygen, and the ions are implanted into the upper layer of the fin 90 (e.g., silicon) by the implantation process 130, in some embodiments. The implantation process 130 may be performed at a temperature between about 200° C. and about 500° C. After the implantation process, an anneal process, such as rapid thermal anneal (RTA) or furnace anneal, may be performed at a temperature between about 400° C. and 800° C. The anneal process repairs lattice damage due to the implantation process, in some embodiments. The implantation process 130 and the anneal process convert the upper layer of the fin 90 into the seed layer 111, in the illustrated embodiment. The seed layer 111 may comprises silicon oxide (e.g., SiO), silicon carbide (e.g., SiC), silicon nitride (e.g., SiN), or silicon carbonitride (e.g., SiCN), as examples. The seed layer 111 facilitates the subsequent selective deposition of a dielectric layer 113 (see FIG. 8) on the seed layer 111. In the example of FIG. 7, the upper surface 111U of the seed layer 111 is between the upper surface and the lower surface of the lowermost inner spacer 55A.

Figure 8:
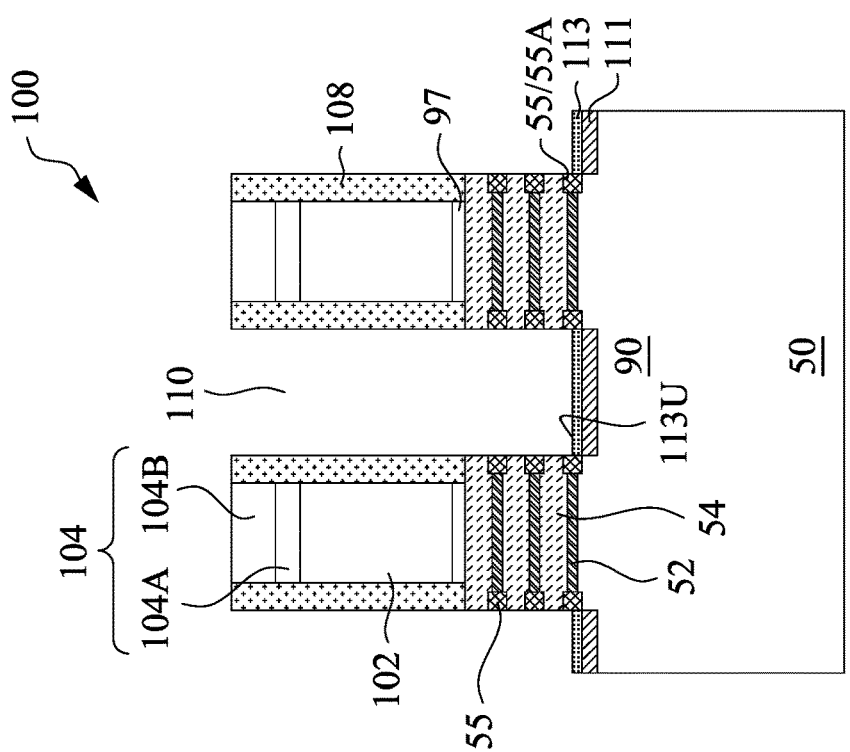

Next, in FIG. 8, a dielectric layer 113 is selectively formed on the seed layer 111. In some embodiments, a selective ALD process is performed to selectively deposit the dielectric layer 113 on the seed layer 111. The selective ALD process may be performed using a precursor comprising silicon (e.g., silane), and one or more precursors comprising oxygen, nitrogen, and/or carbon. In some embodiments, the seed layer 111 and the dielectric layer 113 comprise a same material, such as SiO, SiC, SiN, or SiCN. Due to the seed layer 111, the deposition rate of the dielectric layer 113 on the seed layer 111 is higher than (e.g., five time higher or more) the deposition rate of the dielectric layer 113 on other surfaces, such as surfaces of the inner spacers 55, the second semiconductor material 54, and the gate spacers 108.

As illustrated in FIG. 8, after the selective ALD process is completed, the dielectric layer 113 is formed on the seed layer 111, and surfaces of other structures, such as the inner spacers 55, the second semiconductor material 54, and the gate spacers 108, are free of the dielectric layer 113. In other words, the seed layer 111 is covered by the dielectric layer 113, while other structures, such as the inner spacers 55, the second semiconductor material 54, and the gate spacers 108, are exposed by the dielectric layer 113. In the example of FIG. 8, an upper surface 113U of the dielectric layer 113 is between the upper surface and the lower surface of the lowermost inner spacer 55A. In other embodiments, the upper surface 113U is higher (e.g., further from the substrate) than the upper surface of the lowermost inner spacer 55A, but is between the upper surface and the lower surface of another inner spacer 55 (e.g., an inner spacer 55 further from the substrate 50 than the lowermost inner spacer 55A).

The presently disclosed method allows for selective deposition of the dielectric layer 113 on the seed layer 111, which may not be achievable by other ALD processes (e.g., ALD processes without the presently disclosed method). In the illustrated embodiment, a uniform thickness of the dielectric layer 113 is achieved across the surfaces of the seed layer 111, regardless of the dimension of the spaces between the dummy gates 102, thus reducing or avoiding the space loading effect encountered by the other ALD processes without the presently disclosed method. The selective deposition and the uniform thickness of the dielectric layer 113 facilitate the selective growth of the source/drain material in subsequent processing, as discussed hereinafter.

Figure 9:
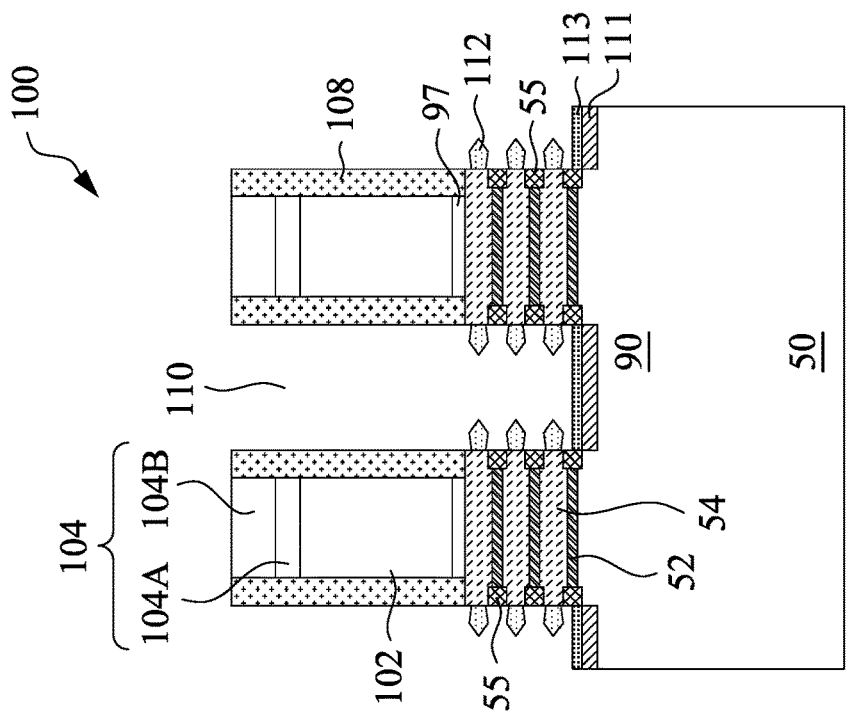

Next, in FIG. 9, a source/drain material 112 is selectively formed in the openings 110 on the exposed sidewalls of the second semiconductor material 54. In the illustrated embodiment, the source/drain material 112 is formed of an epitaxial material(s), and therefore, may also be referred to as an epitaxial source/drain material 112.

In some embodiments, the epitaxial source/drain material 112 is epitaxially grown in the openings 110. The epitaxial source/drain material 112 may include any acceptable material, such as appropriate for n-type or p-type device. For example, when n-type devices are formed, the epitaxial source/drain material 112 may include materials exerting a tensile strain in the channel regions, such as silicon, SiC, SiCP, SiP, or the like. Likewise, when p-type devices are formed, the epitaxial source/drain material 112 may include materials exerting a compressive strain in the channel regions, such as SiGe, SiGeB, Ge, GeSn, or the like.

As illustrated in FIG. 9, the epitaxial source/drain material 112 is selectively formed on the exposed sidewalls of the second semiconductor material 54. In some embodiments, a lattice constant of the epitaxial source/drain material 112 matches a lattice constant of the second semiconductor material 54, and as a result, the epitaxial source/drain material 112 has a high deposition rate (also referred to as a growth rate) on the second semiconductor material 54. On the other hand, the dielectric materials of, e.g., the inner spacers 55, the gate spacers 108, and the dielectric layer 113 are not conducive to the growth of the epitaxial source/drain material 112, and therefore, the deposition rates of the epitaxial source/drain material 112 on these dielectric surfaces are substantially zero.

Due to the selective growth of the epitaxial source/drain material 112 on the second semiconductor material 54, the epitaxial source/drain material 112 has a higher lateral growth rate than the vertical growth rate, in some embodiments. The epitaxial source/drain material 112 on opposing sidewalls of the second semiconductor material 54 exposed by the opening 110 grows and merges to form a source/drain region 112 (also referred to as epitaxial source/drain region 112), as illustrated in FIG. 10.

Figure 10:
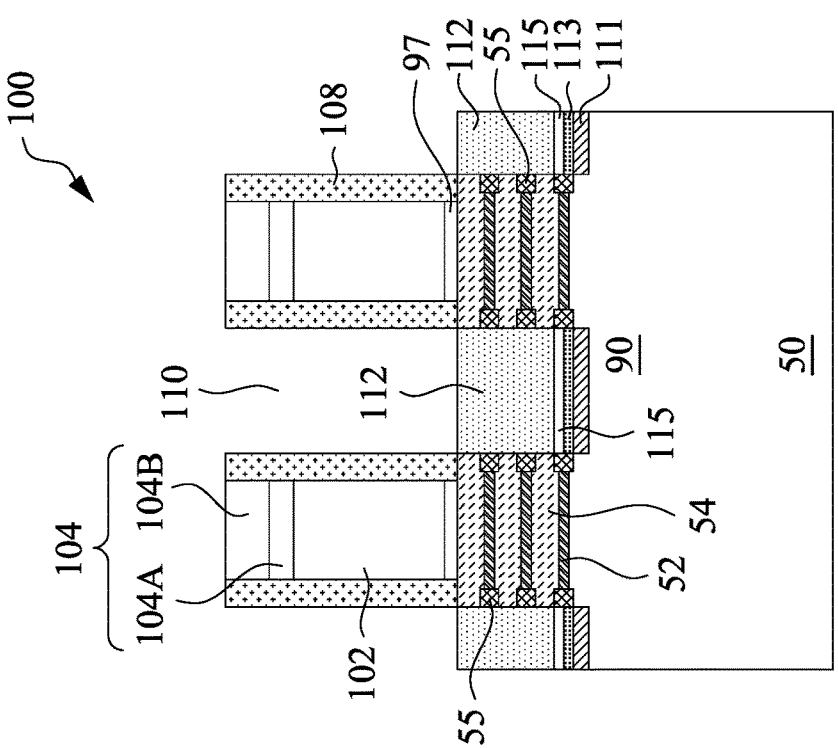

As illustrated in FIG. 10, the source/drain region 112 extends continuously from a first dummy gate 102 (e.g., the dummy gate 102 on the left) to a second adjacent dummy gate 102 (e.g., the dummy gate 102 on the right). Notably, an air gap 115 is formed between each source/drain region 112 and the underlying dielectric layer 113. In the illustrated embodiment, the air gap 115 is formed due to the selective growth of the source/drain material 112 (e.g., no growth of the source/drain material 112 on the dielectric layer 113), also referred to as bottom-to-sidewall growth selectivity of the source/drain material 112. The air gap 115 advantageously reduces or eliminates the leakage current (e.g., leakage current from the source/drain region 112 to the fin 90), and reduces the fringing capacitance of the device formed. In the example of FIG. 10, an upper surface of the air gap 115 distal from the substrate 50 is closer to the substrate 50 than a lower surface of a lowermost nanostructure 54 facing the substrate 50. Note that although the upper surface of the air gap 115 (which is the lower surface of the source/drain region 112) is illustrated as a level, linear surface, the upper surface of the air gap 115 may have a non-regular shape, such as comprising multiple intersecting liner segments, and/or having curved surfaces.

The epitaxial source/drain regions 112 may be implanted with dopants, followed by an anneal process. Appropriate type (e.g., p-type or n-type) of dopants (also referred to as impurities) may be implanted into the epitaxial source/drain regions 112. The n-type impurities may be any suitable n-type impurities, such as phosphorus, arsenic, antimony, or the like, and the p-type impurities may be any suitable p-type impurities, such as boron, $BF_2$, indium, or the like. The source/drain regions may have an impurity concentration of between about $10^{19}$ cm$^{-3}$ and about $10^{21}$ cm$^{-3}$. In some embodiments, the epitaxial source/drain regions 112 may be in situ doped during growth. The anneal process may be performed after the implantation process to activate the dopants.

In some embodiments, the epitaxial source/drain regions 112 are formed to exert stress in the respective channel regions of the NSFET device formed, thereby improving performance. The epitaxial source/drain regions 112 are formed such that each dummy gate 102 is disposed between respective neighboring pairs of the epitaxial source/drain regions 112. In some embodiments, the gate spacers 108 are used to separate the epitaxial source/drain regions 112 from the dummy gates 102 by an appropriate lateral distance so that the epitaxial source/drain regions 112 do not short out subsequently formed replacement gates of the resulting NSFET device.

As a result of the epitaxy processes used to form the epitaxial source/drain regions 112, upper surfaces of the epitaxial source/drain regions 112 have facets which expand laterally outward beyond sidewalls of the fin structures 91. In some embodiment, adjacent epitaxial source/drain regions 112 remain separated (see, e.g., FIG. 11B) after the epitaxy process is completed. In other embodiments, these facets cause adjacent epitaxial source/drain regions 112 of a same NSFET to merge.

Figure 11A:
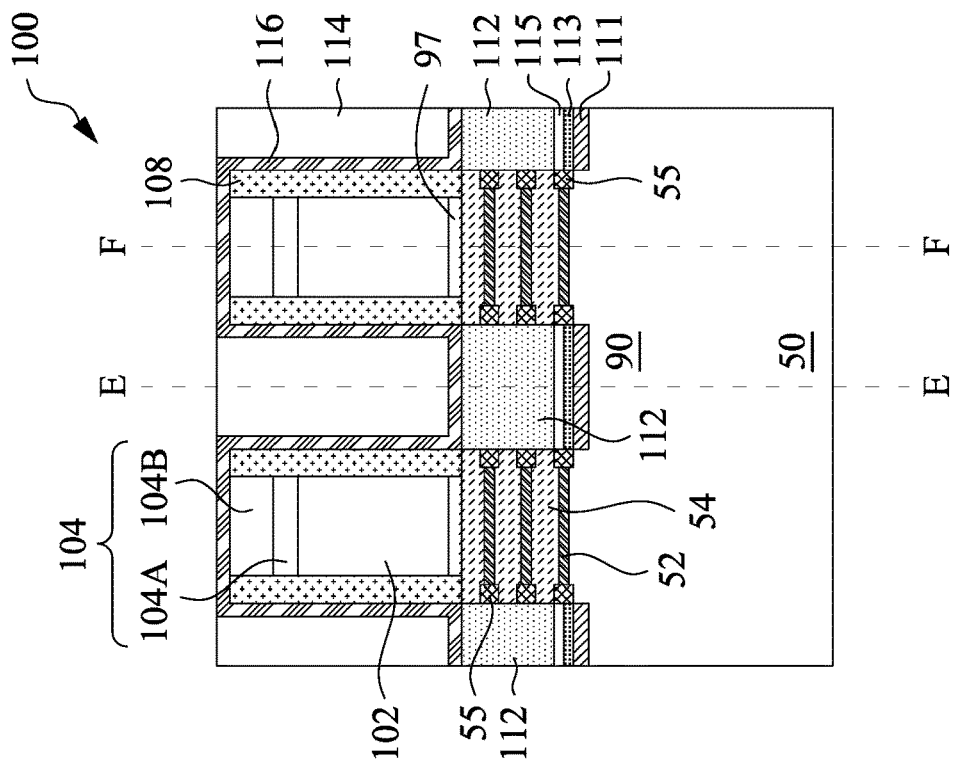

Next, in FIG. 11A, a contact etch stop layer (CESL) 116 is formed (e.g., conformally) over the source/drain regions 112 and over the dummy gate 102, and a first inter-layer dielectric (ILD) 114 is then deposited over the CESL 116. The CESL 116 is formed of a material having a different etch rate than the first ILD 114, and may be formed of silicon nitride using PECVD, although other dielectric materials such as silicon oxide, silicon oxynitride, combinations thereof, or the like, and alternative techniques of forming the CESL 116, such as low pressure CVD (LPCVD), PVD, or the like, could alternatively be used.

Figure 11C:
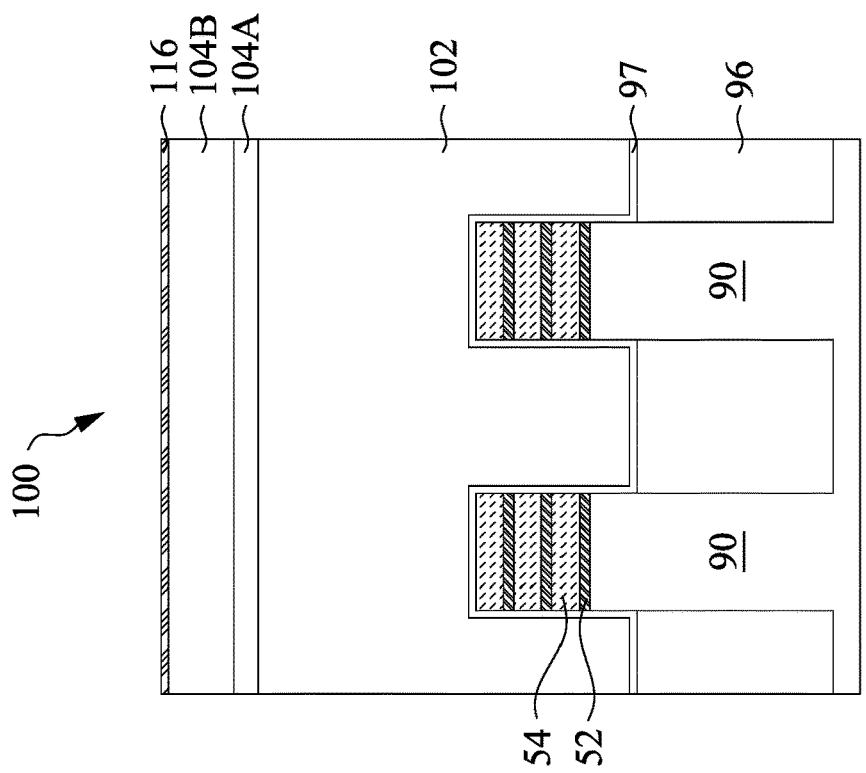
Figure 11B:
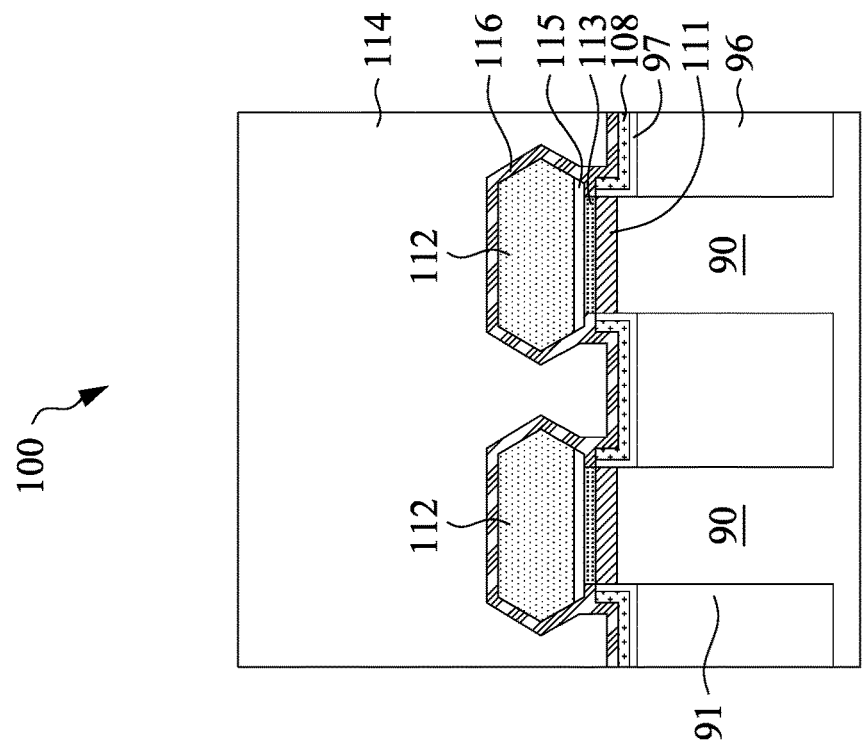

The first ILD 114 may be formed of a dielectric material, and may be deposited by any suitable method, such as CVD, plasma-enhanced CVD (PECVD), or FCVD. Dielectric materials for the first ILD 114 may include silicon oxide, Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used. FIGS. 11B and 11C illustrate cross-sectional views of the NSFET device 100 of FIG. 11A, but along cross-section E-E and F-F in FIG. 11A, respectively. Note that in FIG. 11B, there is an air gap 115 between each source/drain region 112 and the dielectric layer 113 on the underlying fin 90. In some embodiments, the air gap 115 is sealed by the CESL 116 and forms an enclosed space.

Figure 12B:
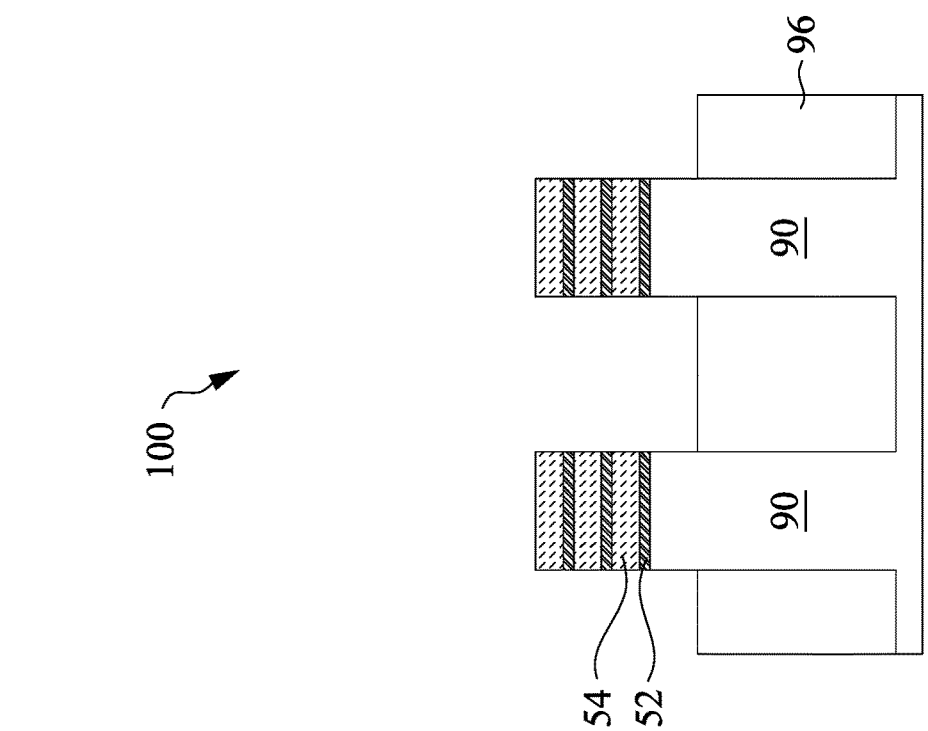
Figure 12A:
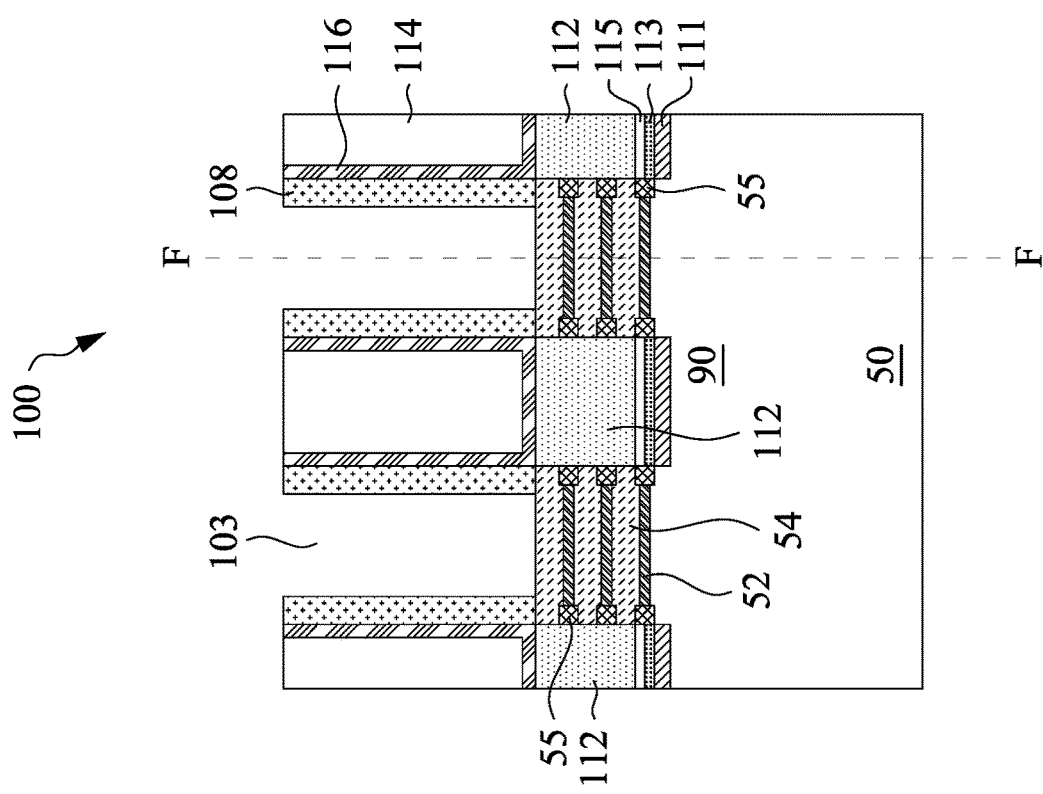

Next, in FIGS. 12A and 12B, the dummy gates 102 and the dummy gate dielectric 97 are removed. To remove the dummy gates 102, a planarization process, such as a CMP, is performed to level the top surfaces of the first ILD 114 and CESL 116 with the top surfaces of the dummy gates 102 and gate spacers 108. The planarization process may also remove the masks 104 (see FIG. 11A) on the dummy gates 102, and portions of the gate spacers 108 along sidewalls of the masks 104. After the planarization process, top surfaces of the dummy gates 102, gate spacers 108, and first ILD 114 are level. Accordingly, the top surfaces of the dummy gates 102 are exposed by the first ILD 114.

Next, the dummy gates 102 are removed in an etching step(s), so that recesses 103 are formed between gate spacers 108. The recesses 103 expose portions of the first semiconductor material 52 and portions of the second semiconductor material 54 that were under the dummy gates 102. In some embodiments, the dummy gates 102 are removed by an anisotropic dry etch process. For example, the etching process may include a dry etch process using reaction gas(es) that selectively etch the dummy gates 102 without etching the first ILD 114 or the gate spacers 108. Each recess 103 exposes the channel regions of the NSFET. Each channel region is disposed between neighboring pairs of the epitaxial source/drain regions 112. During the removal of the dummy gates 102, the dummy gate dielectric 97 may be used as an etch stop layer when the dummy gates 102 are etched. The dummy gate dielectric 97 may then be removed after the removal of the dummy gates 102. In some embodiment, an etching process, such as an isotropic etching process, may be performed to remove the dummy gate dielectric 97. In an embodiment, an isotropic etching process using an etching gas that comprises HF and $NH_3$ is performed to remove the dummy gate dielectric 97. FIG. 12B illustrates the cross-sectional view of the NSFET device 100 of FIG. 12A along the cross-section F-F.

Figure 13B:
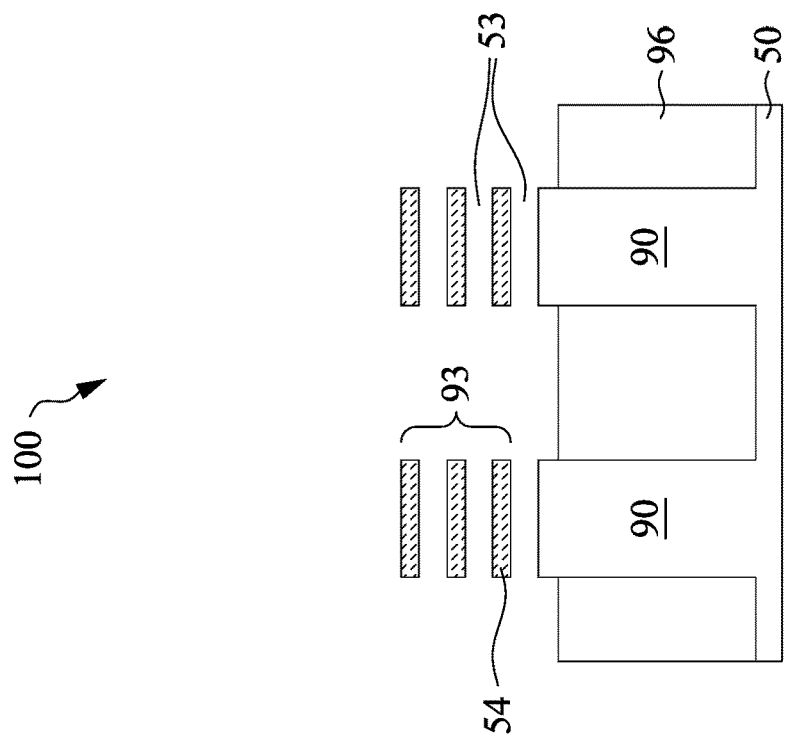
Figure 13A:
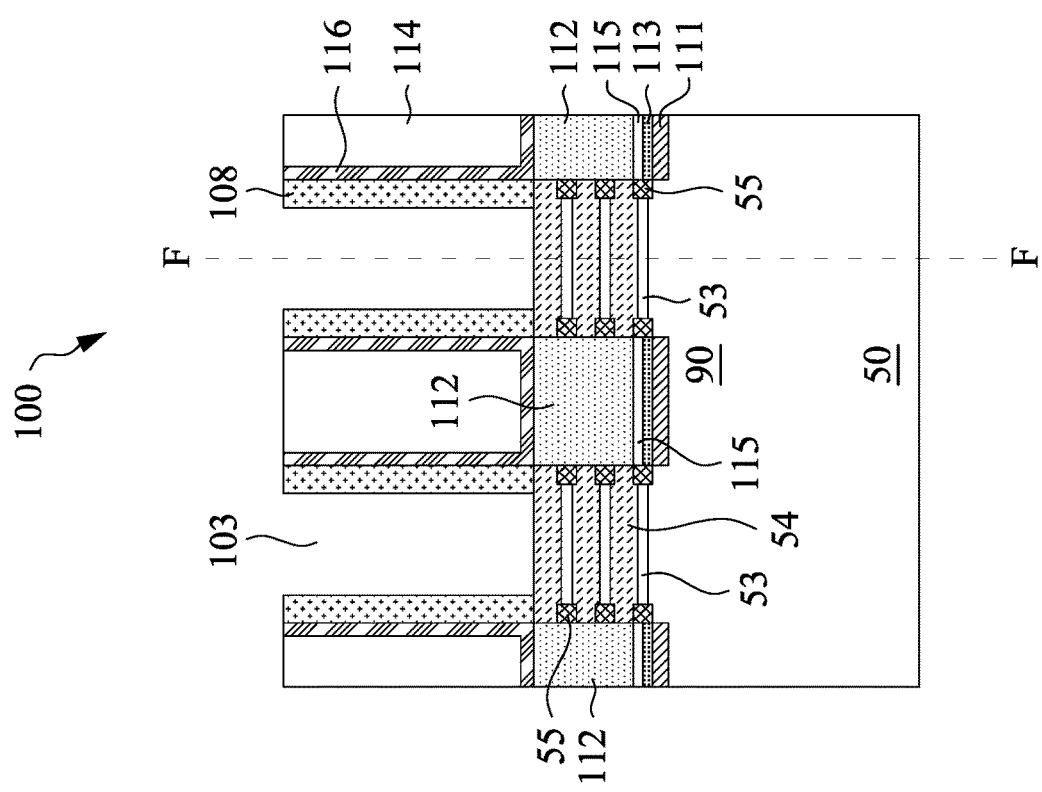

Next, in FIGS. 13A and 13B, the first semiconductor material 52 is removed to release the second semiconductor material 54. After the first semiconductor material 52 is removed, the second semiconductor material 54 forms a plurality of nanostructures 54 that extend horizontally (e.g., parallel to a major upper surface of the substrate 50). The nanostructures 54 may be collectively referred to as the channel regions 93 or the channel layers 93 of the NSFET device 100 formed. As illustrated in FIG. 13A, gaps 53 (e.g., empty spaces) are formed, e.g., between the nanostructures 54, by the removal of the first semiconductor material 52. In some embodiments, the nanostructures 54 are nanosheets or nanowires, depending on, e.g., the dimensions (e.g., size and/or aspect ratio) of the nano structures 54.

In some embodiments, the first semiconductor material 52 is removed by a selective etching process using an etchant that is selective to (e.g., having a higher etch rate for) the first semiconductor material 52, such that the first semiconductor material 52 is removed without substantially attacking the second semiconductor material 54. In some embodiments, an isotropic etching process is performed to remove the first semiconductor material 52. The isotropic etching process may be performed using an etching gas, and optionally, a carrier gas, where the etching gas comprises $F_2$ and HF, and the carrier gas may be an inert gas such as Ar, He, $N_2$, combinations thereof, or the like.

FIG. 13A illustrates the cross-sectional view of the NSFET device 100 along a longitudinal axis of the fin (e.g., along a current flow direction in the fin), and FIG. 13B illustrates the cross-sectional view of the NSFET device 100 along cross-section F-F of FIG. 13A, which is a cross-section along a direction perpendicular to the longitudinal axis of the fin and across a middle portion of the nanostructure 54.

Figure 14B:
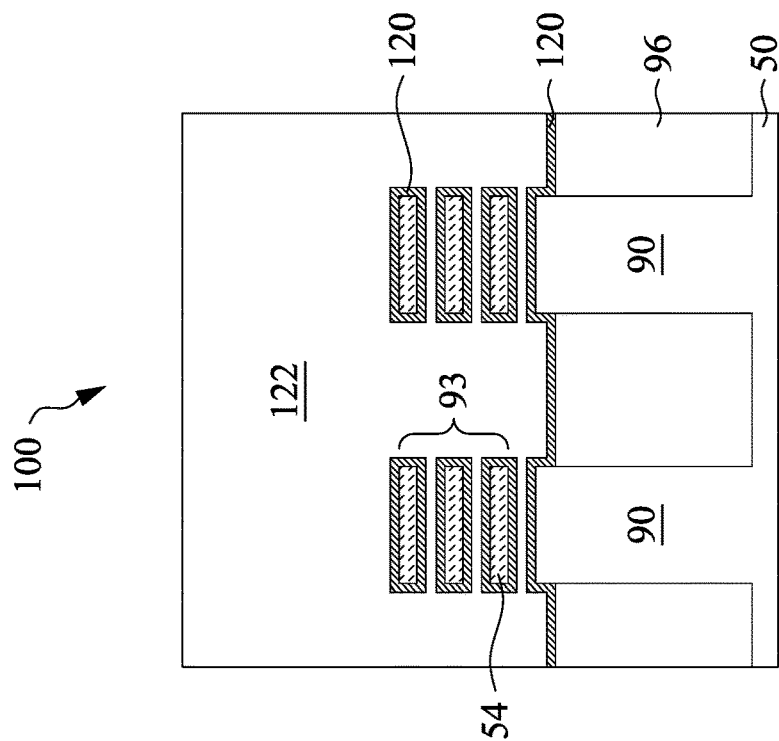
Figure 14A:
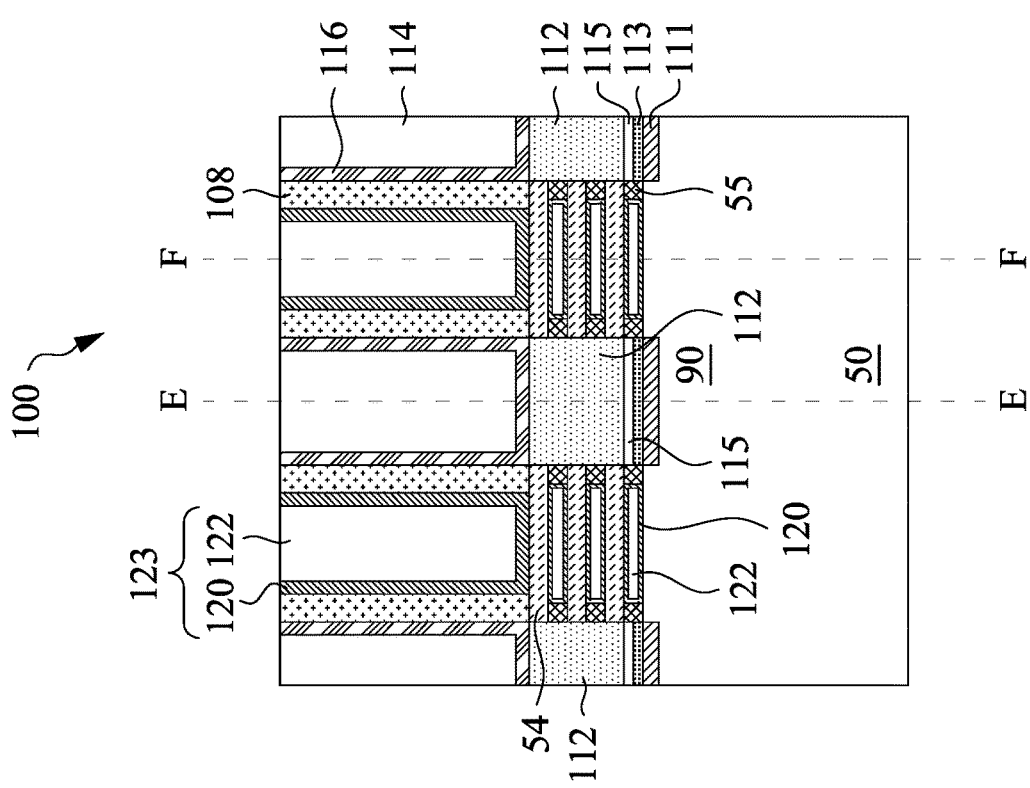

Next, in FIGS. 14A and 14B, gate dielectric layers 120 and gate electrodes 122 are formed for replacement gates. The gate dielectric layers 120 are deposited conformally in the recesses 103, such as on the top surfaces and the sidewalls of the fin 90, and on sidewalls of the gate spacers 108. The gate dielectric layers 120 may also be formed on the top surface of the first ILD 114. Notably, the gate dielectric layers 120 wrap around the nanostructures 54. In accordance with some embodiments, the gate dielectric layers 120 comprise silicon oxide, silicon nitride, or multilayers thereof. In some embodiments, the gate dielectric layers 120 include a high-k dielectric material, and in these embodiments, the gate dielectric layers 120 may have a k value greater than about 7.0, and may include a metal oxide or a silicate of Hf, Al, Zr, La, Mg, Ba, Ti, or Pb, or combinations thereof. The formation methods of the gate dielectric layers 120 may include Molecular-Beam Deposition (MBD), ALD, PECVD, and the like.

Next, the gate electrodes 122 are deposited over and around the gate dielectric layers 120, and fill the remaining portions of the recesses 103. The gate electrodes 122 may include a metal-containing material such as TiN, TiO, TaN, TaC, Co, Ru, Al, W, combinations thereof, or multi-layers thereof. For example, although a single layer gate electrode 122 is illustrated, the gate electrode 122 may comprise any number of liner layers (e.g., barrier layers), any number of work function tuning layers, and a fill material. After the filling of the gate electrodes 122, a planarization process, such as a CMP, may be performed to remove excess portions of the gate dielectric layers 120 and excess portions of the material of the gate electrodes 122, which excess portions are over the top surface of the first ILD 114. The remaining portions of material of the gate electrodes 122 and the gate dielectric layers 120 thus form replacement gates of the resulting NSFET device 100. Each gate electrode 122 and the corresponding gate dielectric layers 120 may be collectively referred to as a gate stack, a replacement gate structure, or a metal gate structure. Each gate stack extends around the respective nanostructures 54. The cross-sectional view of the NSFET device 100 of FIG. 14A along cross-section E-E is the same as or similar to FIG. 11B, thus not repeated here.

Additional processing may be performed to finish fabrication of the NSFET device 100, as one of ordinary skill readily appreciates, thus details may not be repeated here. For example, a second ILD may be deposited over the first ILD 114. Further, gate contacts and source/drain contacts may be formed through the second ILD and/or the first ILD 114 to electrically couple to the gate electrode 122 and the source/drain regions 112, respectively.

Variations of the disclosed embodiments are possible and are fully intended to be included within the scope of the present disclosure. For example, depending on the type of device (e.g., n-type or p-type device) formed, the second semiconductor material 54 may be removed, and the first semiconductor material 52 may remain to form the nanostructures, which nanostructures function as the channel regions of the NSFET device formed. In embodiments where the first semiconductor material 52 remains to form the nanostructures, inner spacers are formed in sidewall recesses in end portions of the second semiconductor material 54 before the second semiconductor material 54 is removed, as one of ordinary skill readily appreciates.

Figure 15:
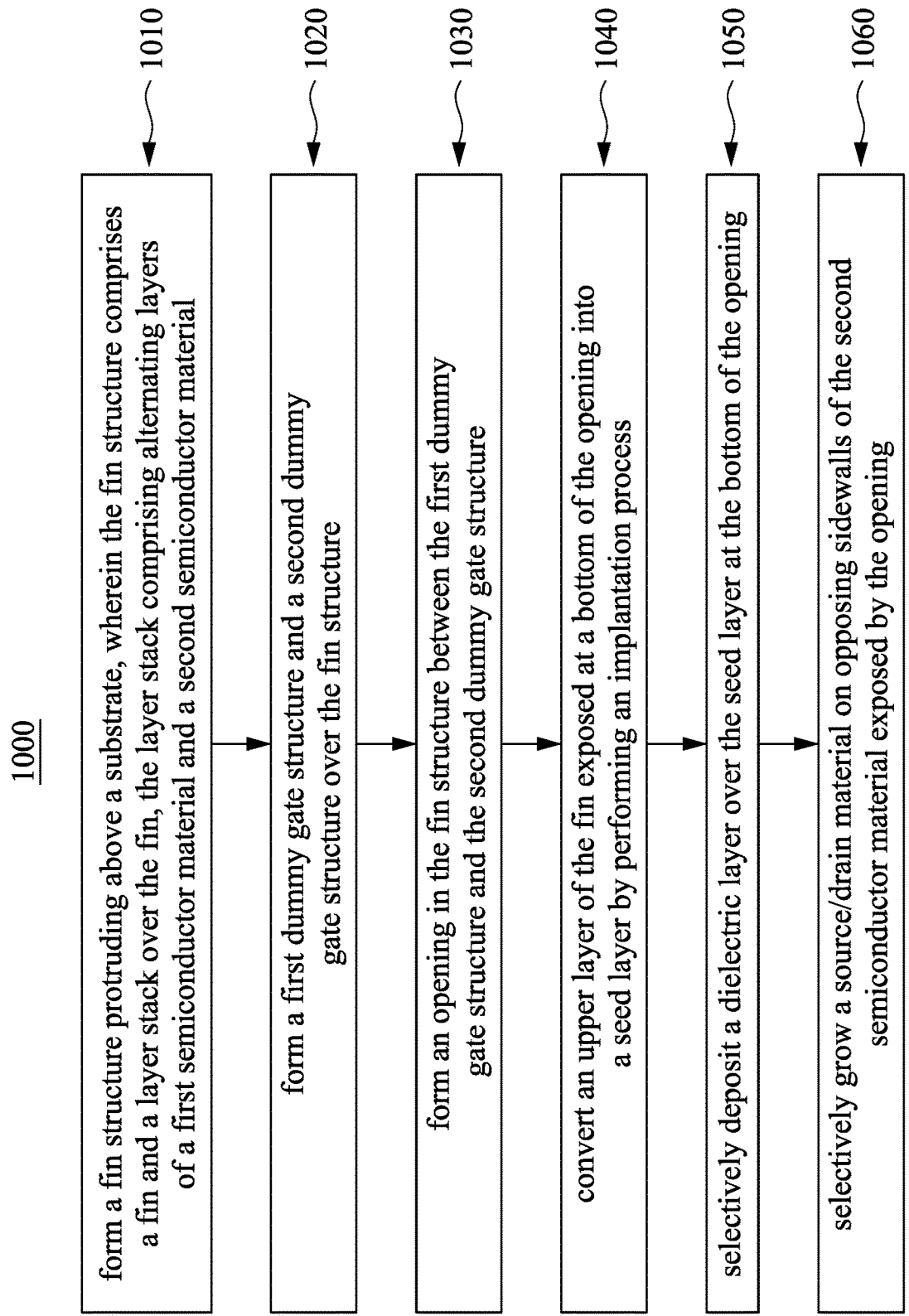
FIG. 15 is a flow chart of a method of forming a semiconductor device, in some embodiments.

FIG. 15 illustrates a flow chart of a method 1000 of fabricating a semiconductor device, in accordance with some embodiments. It should be understood that the embodiment method shown in FIG. 15 is merely an example of many possible embodiment methods. One of ordinary skill in the art would recognize many variations, alternatives, and modifications. For example, various steps as illustrated in FIG. 15 may be added, removed, replaced, rearranged, or repeated.

Referring to FIG. 15, at block 1010, a fin structure is formed protruding above a substrate, wherein the fin structure comprises a fin and a layer stack over the fin, the layer stack comprising alternating layers of a first semiconductor material and a second semiconductor material. At block 1020, a first dummy gate structure and a second dummy gate structure are formed over the fin structure. At block 1030, an opening is formed in the fin structure between the first dummy gate structure and the second dummy gate structure. At block 1040, an upper layer of the fin exposed at a bottom of the opening is converted into a seed layer by performing an implantation process. At block 1050, a dielectric layer is selectively deposited over the seed layer at the bottom of the opening. At block 1060, a source/drain material is selectively grown on opposing sidewalls of the second semiconductor material exposed by the opening.

Embodiments may achieve advantages. The disclosed method, by ion implantation and selective deposition of the dielectric layer 113, among other features, achieves selective growth of the source/drain material 112 (e.g., bottom-to-sidewall growth selectivity), which results in air gaps 115 being formed between the source/drain regions 112 and the underlying fins 90. The air gaps 115 reduce the fringing capacitance of the device formed, and reduce or eliminate the leakage current of the device formed.

In an embodiment, a method of forming a semiconductor device includes: forming a fin structure protruding above a substrate, wherein the fin structure comprises a fin and a layer stack over the fin, the layer stack comprising alternating layers of a first semiconductor material and a second semiconductor material; forming a first dummy gate structure and a second dummy gate structure over the fin structure; forming an opening in the fin structure between the first dummy gate structure and the second dummy gate structure; converting an upper layer of the fin exposed at a bottom of the opening into a seed layer by performing an implantation process; selectively depositing a dielectric layer over the seed layer at the bottom of the opening; and selectively growing a source/drain material on opposing sidewalls of the second semiconductor material exposed by the opening.

In an embodiment, the source/drain material grown on the opposing sidewalls of the second semiconductor material merges to form a source/drain region, wherein there is an air gap between the source/drain region and the dielectric layer. In an embodiment, the method further includes, after forming the opening and before the converting, replacing end portions of the first semiconductor material exposed by the opening with inner spacers. In an embodiment, after selectively depositing the dielectric layer, an upper surface of the dielectric layer distal from the substrate is between a lower surface and an upper surface of a lowermost inner spacer of the inner spacers. In an embodiment, the method further includes, after the implantation process and before selectively depositing the dielectric layer, performing an anneal process. In an embodiment, the fin comprises silicon, and the implantation process is performed using a gas source comprising carbon, nitrogen, oxygen, or combinations thereof. In an embodiment, the dielectric layer is formed of silicon oxide, silicon carbide, silicon nitride, or silicon carbonitride. In an embodiment, after selectively depositing the dielectric layer, the seed layer at the bottom of the opening is covered by the dielectric layer while the opposing sidewalls of the second semiconductor material exposed by the opening are free of the dielectric layer. In an embodiment, a first lattice constant of the source/drain material matches a second lattice constant of the second semiconductor material. In an embodiment, the method further includes: forming an interlayer dielectric (ILD) layer over the fin structure around the first dummy gate structure and the second dummy gate structure; and replacing the first dummy gate structure and the second dummy gate structure with a first replacement gate structure and a second replacement gate structure, respectively. In an embodiment, replacing the first dummy gate structure and the second dummy gate structure comprises: removing the first and the second dummy gate structures to form openings in the ILD layer to expose the first semiconductor material and the second semiconductor material under the first and the second dummy gate structures; selectively removing the exposed first semiconductor material using a first etching process, wherein after the first etching process, the exposed second semiconductor material remains and forms channel regions of the semiconductor device; forming a gate dielectric material around the channel regions; and forming a gate material around the gate dielectric material.

In an embodiment, a method of forming a semiconductor device includes: forming a fin structure over a substrate, the fin structure comprising a fin and a layer stack over the fin, the layer stack comprising alternating layers of a first semiconductor material and a second semiconductor material; forming a dummy gate structure over the fin structure; forming an opening in the fin structure adjacent to the dummy gate structure, wherein sidewalls of the opening expose first end portions of the first semiconductor material and expose second end portions of the second semiconductor material, and wherein a bottom of the opening exposes an upper surface of the fin; replacing the first end portions of the first semiconductor material with inner spacers; and forming a source/drain region in the opening, comprising: selectively depositing a dielectric layer over the upper surface of the fin; and selectively growing a source/drain material on the second end portions of the second semiconductor material using an epitaxial growth process, wherein after the epitaxial growth process, the source/drain material is spaced apart from the dielectric layer. In an embodiment, the method further includes, before selectively depositing the dielectric layer, performing an implantation process to convert an upper layer of the fin into a seed layer, wherein the seed layer comprise a same material as the dielectric layer. In an embodiment, the method further includes, after performing the implantation process, performing an anneal process. In an embodiment, the implantation process is performed using a gas source comprising carbon, nitrogen, oxygen, or combinations thereof, wherein the dielectric layer comprises silicon oxide, silicon carbide, silicon nitride, or silicon carbonitride. In an embodiment, the source/drain material grown on opposing sidewalls of the second semiconductor material merge to form the source/drain region, wherein there is an air gap between the source/drain region and the dielectric layer.

In an embodiment, a semiconductor device includes: a fin protruding above a substrate; a first gate structure over the fin; a second gate structure over the fin; a source/drain region over the fin between the first gate structure and the second gate structure, wherein there is an air gap between the source/drain region and the fin; and first channel layers under the first gate structure and second channel layers under the second gate structure, wherein the source/drain region extends continuously from the first channel layers to the second channel layers. In an embodiment, the first channel layers and the second channel layers are nanosheets or nanowires. In an embodiment, an upper surface of the air gap distal from the substrate is closer to the substrate than a lower surface of a lowermost channel layer of the first channel layers facing the substrate. In an embodiment, the semiconductor device further includes a dielectric layer between the first gate structure and the second gate structure, wherein the dielectric layer is on an upper surface of the fin, wherein the air gap is between the source/drain region and the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a fin structure protruding above a substrate, wherein the fin structure comprises a fin and a layer stack over the fin, the layer stack comprising alternating layers of a first semiconductor material and a second semiconductor material;
    forming a first dummy gate structure and a second dummy gate structure over the fin structure;
    forming an opening in the fin structure between the first dummy gate structure and the second dummy gate structure;
    converting an upper layer of the fin exposed at a bottom of the opening into a seed layer by performing an implantation process;
    selectively depositing a dielectric layer over the seed layer at the bottom of the opening; and
    selectively growing a source/drain material on opposing sidewalls of the second semiconductor material exposed by the opening.

2. The method of claim 1, wherein the source/drain material grown on the opposing sidewalls of the second semiconductor material merges to form a source/drain region, wherein there is an air gap between the source/drain region and the dielectric layer.

3. The method of claim 2, further comprising, after forming the opening and before the converting, replacing end portions of the first semiconductor material exposed by the opening with inner spacers.

4. The method of claim 3, wherein after selectively depositing the dielectric layer, an upper surface of the dielectric layer distal from the substrate is between a lower surface and an upper surface of a lowermost inner spacer of the inner spacers.

5. The method of claim 2, further comprising, after the implantation process and before selectively depositing the dielectric layer, performing an anneal process.

6. The method of claim 2, wherein the fin comprises silicon, and the implantation process is performed using a gas source comprising at least one member selected from the group consisting of carbon, nitrogen, and oxygen.

7. The method of claim 6, wherein the dielectric layer is formed of a material selected from the group consisting of silicon oxide, silicon carbide, silicon nitride, and silicon carbonitride.

8. The method of claim 2, wherein after selectively depositing the dielectric layer, the seed layer at the bottom of the opening is covered by the dielectric layer while the opposing sidewalls of the second semiconductor material exposed by the opening are free of the dielectric layer.

9. The method of claim 8, wherein a first lattice constant of the source/drain material matches a second lattice constant of the second semiconductor material.

10. The method of claim 2, further comprising:
forming an interlayer dielectric (ILD) layer over the fin structure around the first dummy gate structure and the second dummy gate structure; and
replacing the first dummy gate structure and the second dummy gate structure with a first replacement gate structure and a second replacement gate structure, respectively.

11. The method of claim 10, wherein replacing the first dummy gate structure and the second dummy gate structure comprises:
removing the first and the second dummy gate structures to form openings in the ILD layer to expose the first semiconductor material and the second semiconductor material under the first and the second dummy gate structures;
selectively removing the exposed first semiconductor material using a first etching process, wherein after the first etching process, the exposed second semiconductor material remains and forms channel regions of the semiconductor device;
forming a gate dielectric material around the channel regions; and
forming a gate material around the gate dielectric material.

12. A method of forming a semiconductor device, the method comprising:
forming a fin structure over a substrate, the fin structure comprising a fin and a layer stack over the fin, the layer stack comprising alternating layers of a first semiconductor material and a second semiconductor material;
forming a dummy gate structure over the fin structure;
forming an opening in the fin structure adjacent to the dummy gate structure, wherein sidewalls of the opening expose first end portions of the first semiconductor material and expose second end portions of the second semiconductor material, and wherein a bottom of the opening exposes an upper surface of the fin;
replacing the first end portions of the first semiconductor material with inner spacers; and
forming a source/drain region in the opening, comprising:
selectively depositing a dielectric layer over the upper surface of the fin; and
selectively growing a source/drain material on the second end portions of the second semiconductor material using an epitaxial growth process, wherein after the epitaxial growth process, the source/drain material is spaced apart from the dielectric layer.

13. The method of claim 12, further comprising, before selectively depositing the dielectric layer, performing an implantation process to convert an upper layer of the fin into a seed layer, wherein the seed layer comprises a same material as the dielectric layer.

14. The method of claim 13, further comprising, after performing the implantation process, performing an anneal process.

15. The method of claim 13, wherein the implantation process is performed using a gas source selected from the group consisting of carbon, nitrogen, and oxygen, or a mixture thereof, wherein the dielectric layer comprises a material selected from the group consisting of silicon oxide, silicon carbide, silicon nitride, and silicon carbonitride.

16. The method of claim 12, wherein the source/drain material grown on opposing sidewalls of the second semiconductor material merges to form the source/drain region, wherein there is an air gap between the source/drain region and the dielectric layer.

17. A method of forming a semiconductor device, the method comprising:
forming a gate structure over a fin structure, wherein the fin structure comprises a fin and a layer stack over the fin, the layer stack comprising alternating layers of a first semiconductor material and a second semiconductor material;
forming a source/drain opening in the fin structure adjacent to the gate structure, wherein a bottom of the source/drain opening exposes an upper surface of the fin, wherein the source/drain opening exposes first end portions of the first semiconductor material and exposes second end portions of the second semiconductor material;
replacing the first end portions of the first semiconductor material with inner spacers;
covering the upper surface of the fin with a dielectric layer; and
selectively growing a source/drain material on the second end portions of the second semiconductor material, wherein the source/drain material grown on the second end portions of the second semiconductor material merges to form a source/drain region, wherein there is an air gap between the source/drain region and the dielectric layer.

18. The method of claim 17, wherein covering the upper surface of the fin comprises selectively forming the dielectric layer on the upper surface of the fin.

19. The method of claim 18, wherein the selective forming comprises:
performing an implantation process to convert an upper layer of the fin into a seed layer; and
selectively depositing the dielectric layer on the seed layer.

20. The method of claim 19, wherein the seed layer and the dielectric layer comprise a same dielectric material.

* * * * *